(12) United States Patent
Arai et al.

(10) Patent No.: US 7,763,922 B2
(45) Date of Patent: Jul. 27, 2010

(54) SEMICONDUCTOR MEMORY AND METHOD FOR MANUFACTURING THE SAME

(75) Inventors: Hideyuki Arai, Osaka (JP); Takashi Nakabayashi, Osaka (JP); Takashi Ohtsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 174 days.

(21) Appl. No.: 11/152,109

(22) Filed: Jun. 15, 2005

(65) Prior Publication Data

US 2006/0086960 A1 Apr. 27, 2006

(30) Foreign Application Priority Data

Oct. 27, 2004 (JP) ............... 2004-312959

(51) Int. Cl.
*H01L 31/062* (2006.01)
(52) U.S. Cl. ............... 257/301; 257/E27.092
(58) Field of Classification Search ............... 257/304, 257/E27.092, 301
See application file for complete search history.

(56) References Cited

U.S. PATENT DOCUMENTS

| | | | |
|---|---|---|---|
| 6,051,859 A | 4/2000 | Hosotani et al. | |
| 6,207,524 B1 | 3/2001 | Gutsche | |
| 6,271,084 B1 * | 8/2001 | Tu et al. | 438/253 |
| 6,531,358 B1 | 3/2003 | Yu | |
| 6,720,232 B1 * | 4/2004 | Tu et al. | 438/396 |
| 6,750,495 B1 | 6/2004 | Alers et al. | |
| 2002/0079522 A1 * | 6/2002 | Diodato et al. | 257/296 |
| 2002/0110971 A1 | 8/2002 | Shibata | |
| 2002/0113237 A1 * | 8/2002 | Kitamura | 257/71 |
| 2003/0006444 A1 | 1/2003 | Amo et al. | |
| 2003/0073286 A1 | 4/2003 | Chiang et al. | |
| 2003/0168750 A1 * | 9/2003 | Basceri et al. | 257/915 |
| 2004/0109342 A1 | 6/2004 | Fujino | |
| 2005/0124114 A1 | 6/2005 | Ichimura | |

FOREIGN PATENT DOCUMENTS

| | | |
|---|---|---|
| JP | 10-079478 | 3/1998 |
| JP | 10-209391 | 8/1998 |
| JP | 2000-124427 | 4/2000 |
| JP | 2000-332221 | 11/2000 |
| JP | 2001-036035 | 2/2001 |
| JP | 2001-094070 | 4/2001 |

(Continued)

OTHER PUBLICATIONS

Japanese Office Action, with English translation, issued in Japanese Patent Application No. 2004-312959, mailed Nov. 4, 2009.

(Continued)

*Primary Examiner*—Kimberly D Nguyen
*Assistant Examiner*—Amar Movva
(74) *Attorney, Agent, or Firm*—McDermott Will & Emery LLP (57) ABSTRACT

A capacitor of a semiconductor memory of the present invention includes: a lower electrode which covers the surface of a storage node hole from the bottom to at least one of the sidewalls up to a level lower than the top surface of a second interlayer insulating film; a capacitive insulating film which covers the lower electrode; and an upper electrode which covers the capacitive insulating film.

20 Claims, 8 Drawing Sheets

FOREIGN PATENT DOCUMENTS

| | | |
|---|---|---|
| JP | 2002-141424 A | 5/2002 |
| JP | 2002-313954 | 10/2002 |
| JP | 2002-319636 | 10/2002 |
| JP | 2003-023111 | 1/2003 |
| JP | 2003-142602 | 5/2003 |
| JP | 2004-186501 | 7/2004 |
| JP | 2004-274051 | 9/2004 |
| JP | 2002-083940 | 3/2005 |
| JP | 2005-191534 | 7/2005 |

OTHER PUBLICATIONS

Japanese Notice of Reasons for Rejection, w/English translation thereof, issued in Japanese Patent Application NO. JP 2004-312959 dated Jan. 26, 2010.

* cited by examiner

SEMICONDUCTOR MEMORY AND METHOD FOR MANUFACTURING THE SAME

CROSS-REFERENCE TO RELATED APPLICATION

This non-provisional application claims priority under 35 U.S.C. §119(a) on Patent Application No. 2004-312959 filed in Japan on Oct. 27, 2004, the entire contents of which are hereby incorporated by reference.

BACKGROUND OF THE INVENTION (a) Field of the Invention

The present invention relates to a semiconductor memory and a method for manufacturing the same. In particular, it relates to a semiconductor memory such as a DRAM and a method for manufacturing the same.

(b) Description of Related Art

So far, concave capacitive electrodes have been used for DRAMs of a capacitor-under-bitline (CUB) structure having charge storing capacitive elements under bit lines. With use of the concave capacitive electrode in a DRAM, the surface of an interlayer insulating film formed on the DRAM becomes flat. Therefore, the concave capacitive electrode has been paid attention for its usefulness for device miniaturization (e.g., see Japanese Unexamined Patent Publication No. 2002-141424).

Figure 8A:
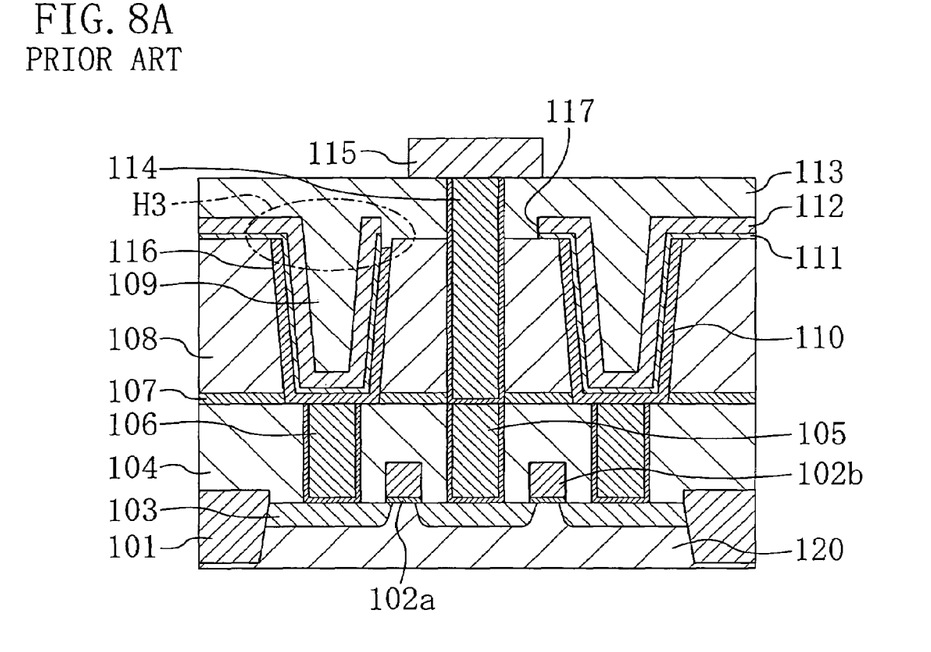
FIGS. 8A and 8B are a sectional view and a plan view illustrating a configuration of a conventional embedded semiconductor DRAM, respectively.
Figure 8B:
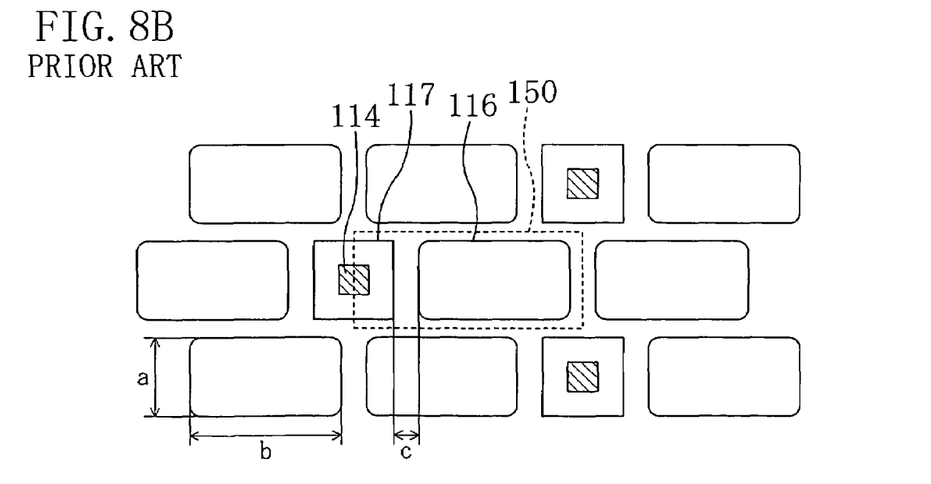

Hereinafter, referring to FIGS. 8A and 8B, an explanation is given of a configuration of a conventional embedded semiconductor DRAM including a concave capacitive electrode. FIGS. 8A and 8B are a sectional view and a plan view illustrating a configuration the conventional embedded semiconductor DRAM, respectively. As shown in FIG. 8A, the conventional DRAM includes: a silicon wafer 120; isolation trenches (STIs) 101 formed to surround part of the silicon wafer 120 where a transistor will be formed; a gate insulating film 102a and a gate electrode 102b formed on the silicon wafer 120; a source/drain diffusion layer 103 formed in part of the silicon wafer 120 located at each side of the gate electrode; a first interlayer insulating film 104 formed on the silicon wafer 120, a first bit line contact 105 and a capacitor contact 106 which penetrate the first interlayer insulating film 104 to reach the source/drain diffusion layer 103, respectively; an insulating film 107 formed on the first interlayer insulating film 104; a second interlayer insulating film 108 formed on the insulating film 107; a lower electrode 110 covering the bottom and the sidewalls of a storage node hole 116 which penetrates the second interlayer insulating film 108 to reach the top surface of the capacitor contact 106; a capacitive insulating film 111 covering the lower electrode 110 and the second interlayer insulating film 108 outside the storage node hole 116; an upper electrode 112 covering the capacitive insulating film 111; a third interlayer insulating film 113 formed over the upper electrode 112 to bury the storage node hole 116; a second bit line contact 114 which penetrates the third interlayer insulating film 113 and the second interlayer insulating film 108 to reach the first bit line contact 105; and a first wiring layer 115 formed on the third interlayer insulating film 113 to be connected to the second bit line contact 114.

In the step of manufacturing the semiconductor device shown in FIG. 8A, the upper electrode 112 is subjected to etching using a mask (not shown) formed thereon, thereby forming an opening 117 for forming the second bit line contact 114. The opening 117 is formed above the second interlayer insulating film 108 where the storage node hole 109 is not formed. Then, a contact hole (not shown) is formed to penetrate the third interlayer insulating film 113 and the second interlayer insulating film 108 below the opening 117 and then filled with a conductive film (not shown), thereby forming the second bit line contact 114.

In a plan view of the conventional embedded semiconductor DRAM, as shown in FIG. 8B, a margin c is provided between the storage node hole 116 having a short side length a and a long side length b (planar shape of a capacitor) and the opening 117. The margin c is provided to absorb misalignment of the mask used to form the opening 117.

However, the margin c is narrowed as the device is further miniaturized. Therefore, if the mask for forming the opening 117 is misaligned and etching is carried out with the misaligned mask, the capacitive insulating film 111 and the lower electrode 112 formed in the storage node hole 116 are likely to be etched away. As shown in FIG. 8A, at the top end part H3 of the storage node hole 116 (part of the sidewalls of the hole 116 closer to the top surface of the second interlayer insulating film 108), the upper electrode 112 is removed, whereby the capacitive insulating film 111 and the lower electrode 110 are exposed or partially etched away. As a result, the lower electrode 110 decreases in area, thereby reducing the amount of storable capacitance. Further, the capacitive insulating film which contributes to the capacitance is damaged by the etching to cause leakage current.

In the DRAM which employs the concave capacitive electrode, capacitance cannot be stored in any other parts than the capacitive insulating film formed in the storage node hole 116. Therefore, if the electrode area decreases as a result of the miniaturization, the amount of storable capacitance also decreases. This brings about a problem in that the required amount of capacitance for memory operation cannot be maintained.

SUMMARY OF THE INVENTION

Under these circumstances, an object of the present invention is to provide an embedded semiconductor DRAM capable of realizing device miniaturization, suppressing leakage current and storing a large amount of capacitance, and a method for manufacturing the same.

A first semiconductor memory according to the present invention comprises a capacitor which covers the surface of a trench formed in part of an insulating film, wherein the capacitor includes: a lower electrode which covers the surface of the trench from the bottom to at least one of the sidewalls up to a level lower than the top surface of the insulating film; a capacitive insulating film which covers the lower electrode and part of said at least one of the sidewalls of the trench higher than part of said at least one of the sidewalls of the trench covered with the lower electrode; and an upper electrode which is formed on the capacitive insulating film and covers the part of said at least one of the sidewalls of the trench higher than the part covered with the lower electrode with the capacitive insulating film lying in between.

The lower electrode, capacitive insulating film and upper electrode may be formed at least one of the sidewalls of the trench.

In such a semiconductor memory, the lower electrode is positioned below the top surface of the insulating film. Accordingly, the upper electrode is formed along the trench surface at the top end part of the trench (part of the trench sidewalls closer to the top surface of the insulating film). As a result, part of the upper electrode at the top end part of the trench is given with a large thickness (thickness in the vertical direction). Therefore, even if an opening, which is supposed to be formed in a region other than the capacitor region, is misaligned to overlap the capacitor and the upper electrode is over-etched in the vertical direction, part of the capacitive insulating film which stores the capacitance of the capacitor will not be exposed. The part of the capacitive insulating film which stores the capacitance of the capacitor mentioned above is part of the capacitive insulating film sandwiched between the upper and lower electrodes. For example, the lower electrode is not formed at the top end part of the trench on which part of the capacitive insulating film is directly formed. Therefore, even if this part of the capacitive insulating film is exposed by over-etching for forming the opening, adverse effect such as the occurrence of leakage current is not caused. Thus, in the first semiconductor memory of the present invention, the capacitive insulating film which contributes to the capacitance of the capacitor will not be damaged even if the opening is formed to overlap the capacitor. This eliminates the need of providing an alignment margin between the opening and the trench, though it has been necessary in conventional techniques. As a result, the trench is enlarged to be in contact with the opening at the top end part thereof, while the memory cell size is not changed. Thus, a larger amount of capacitance is stored in the capacitor while device miniaturization is achieved.

Specifically, the above-mentioned opening is an opening for forming a bit line contact in a semiconductor memory of a CUB structure. In such a semiconductor memory, the upper electrode is formed over the capacitive insulating film in the trench and the insulating film outside the trench, an opening is formed in at least part of the region of the upper electrode formed on the top surface of the insulating film to reach the insulating film, and the semiconductor memory further comprises a bit line contact which penetrates part of the insulating film below the opening.

If the opening is misaligned from the desired position, the opening is formed above the top surface of the insulating film to overlap the capacitor and the bottom of part of the opening overlapping the capacitor is positioned higher than the upper end of the lower electrode.

If the semiconductor memory is a DRAM, it includes: a semiconductor substrate; a gate insulating film formed on the semiconductor substrate; a gate electrode formed on the gate insulating film; an impurity diffusion layer formed in part of the semiconductor substrate located to each side of the gate electrode; an interlayer insulating film formed on the semiconductor substrate; and a capacitor contact which penetrates the interlayer insulating film to reach the impurity diffusion layer, wherein the insulating film is formed above the interlayer insulating film and the bottom of the trench reaches the top of the capacitor contact.

The upper end of the lower electrode is positioned lower than the top surface of the insulating film by a distance which is 0.3 or more times larger than the thickness of the upper electrode. With this configuration, part of the capacitive insulating film which stores the capacitance is surely prevented from being exposed by over-etching for forming the opening.

A second semiconductor memory of the present invention comprises a capacitor which covers the surface of a trench formed in part of an insulating film, wherein the insulating film includes a first insulating film and a second insulating film which is formed on the first insulating film and protrudes toward the inside of the trench beyond the first insulating film on at least one of the sidewalls of the trench and the capacitor includes a lower electrode which covers part of the surface of the trench where the first insulating film is exposed, a capacitive insulating film which covers the lower electrode and part of the surface of the trench where the second insulating film is exposed and an upper electrode which covers the capacitive insulating film.

In such a semiconductor memory, part of the capacitive insulating film which covers the second insulating film forming the trench surface does not store the capacitance of the capacitor. Therefore, even if an opening, which is supposed to be formed in a region other than the capacitor region, is misaligned to overlap the capacitor and the upper electrode is over-etched in the vertical direction, part of the capacitive insulating film which stores the capacitance of the capacitor will not be exposed. Thus, in the second semiconductor memory of the present invention, the capacitive insulating film which contributes to the capacitance will not be damaged even if the opening is formed to overlap the capacitor. This eliminates the need of providing an alignment margin between the opening and the trench, though it has been necessary in conventional techniques. As a result, the trench is enlarged to be in contact with the opening at the top end part thereof, while the memory cell size is not changed. Thus, a larger amount of capacitance is stored in the capacitor while device miniaturization is achieved.

The upper end of the lower electrode is preferably thinner than the other part of the lower electrode. By so doing, the upper electrode is reduced in level difference which is generated at part thereof covering the boundary between the first and second insulating films forming the trench sidewalls. As a result, even if the opening is misaligned to overlap the capacitor, the capacitive insulating film formed on the first insulating film forming the trench sidewalls is less likely to be removed.

The second insulating film preferably protrudes toward the inside of the trench beyond the first insulating film by a length larger than the difference in thickness between the lower electrode and the capacitive insulating film. By so doing, part of the capacitive insulating film which stores the capacitance is surely prevented from being removed.

Specifically, the above-mentioned opening is an opening for forming a bit line contact in a semiconductor memory of a CUB structure. In such a semiconductor memory, the upper electrode is formed over the capacitive insulating film in the trench and the insulating film outside the trench, an opening is formed in at least part of the region of the upper electrode formed on the top surface of the insulating film to reach the insulating film, and the semiconductor memory further comprises a bit line contact which penetrates part of the insulating film below the opening.

If the semiconductor memory is a DRAM, it includes: a semiconductor substrate; a gate insulating film formed on the semiconductor substrate; a gate electrode formed on the gate insulating film; an impurity diffusion layer formed in part of the semiconductor substrate located to each side of the gate electrode; an interlayer insulating film formed on the semiconductor substrate; and a capacitor contact which penetrates the interlayer insulating film to reach the impurity diffusion layer, wherein the insulating film is formed above the interlayer insulating film and the bottom of the trench reaches the top of the capacitor contact.

The first insulating film may be made of phospho-silicate glass (PSG) and the second insulating film may be made of non-doped silicate glass (NSG). The NSG is lower in wet-etch rate than the PSG. Therefore, if the trench is formed by wet etching, the second insulating film remains protruding toward the inside of the trench beyond the first insulating film.

The second insulating film may be made of the same material as the first insulating film and doped with boron. The wet-etch rate decreases with an increase in boron concentration. Therefore, if the trench is formed by wet etching, the second insulating film remains protruding toward the inside of the trench beyond the first insulating film.

The present invention further provides a first method for manufacturing a semiconductor memory comprising a capacitor including a lower electrode, an upper electrode and a capacitive insulating film interposed between the lower electrode and the upper electrode. The method comprises the steps of: (a) forming a trench in part of an insulating film; (b) forming a conductive film which covers the bottom surface and the sidewalls of the trench, forming a mask which covers part of the conductive film located on a lower part of the trench and removing part of the conductive film uncovered with the mask by anisotropic etching to form the lower electrode which covers the surface of the trench from the bottom to the sidewalls up to a level lower than the top surface of the insulating film; (c) forming the capacitive insulating film on the lower electrode; and (d) forming the upper electrode on the capacitive insulating film.

According to the manufacturing method, the lower electrode is positioned below the top surface of the insulating film. Accordingly, the upper electrode is formed along the trench surface at the top end part of the trench. As a result, part of the upper electrode at the top end part of the trench is given with a large thickness (thickness in the vertical direction). Therefore, even if an opening, which is supposed to be formed in a region other than the capacitor region after the step (d), is misaligned to overlap the capacitor and the upper electrode is over-etched in the vertical direction, part of the capacitive insulating film which stores the capacitance of the capacitor will not be exposed. Thus, the capacitive insulating film which contributes to the capacitance of the capacitor will not be damaged even if the opening is formed to overlap the capacitor. This eliminates the need of providing an alignment margin between the opening and the trench, though it has been necessary in conventional techniques. As a result, the trench is enlarged to be in contact with the opening at the top end part thereof, while the memory cell size is not changed. Thus, a larger amount of capacitance is stored in the capacitor while device miniaturization is achieved.

Specifically, the above-mentioned opening is an opening for forming a bit line contact in a semiconductor memory of a CUB structure. According to this manufacturing method, in the step (d), the upper electrode is formed over the capacitive insulating film in the trench and the insulating film outside the trench. The method further comprises the steps of: (e) forming on the upper electrode a mask having an opening corresponding to part of the region of the upper electrode formed on the top surface of the insulating film and forming an opening in the upper electrode by etching; and (f) forming a bit line contact which penetrates part of the insulating film below the opening.

The present invention further provides a second method for manufacturing a semiconductor memory comprising a capacitor including a lower electrode, an upper electrode and a capacitive insulating film interposed between the lower electrode and the upper electrode. The method comprises the steps of: (a) forming a first insulating film and forming a second insulating film having a lower wet-etch rate than the first insulating film on the first insulating film; (b) wet-etching the first insulating film and the second insulating film to form a trench which penetrates the second insulating film and the first insulating film and in which the second insulating film protrudes toward the inside of the trench beyond the first insulating film; (c) forming the lower electrode which covers part of the surface of the trench where the first insulating film is exposed; (d) forming the capacitive insulating film on the lower electrode; and (e) forming the upper electrode on the capacitive insulating film.

According to the manufacturing method, part of the capacitive insulating film which covers the second insulating film forming the trench surface does not store the capacitance of the capacitor. Therefore, even if an opening, which is supposed to be formed in a region other than the capacitor region after the step (e), is misaligned to overlap the capacitor and the upper electrode is over-etched in the vertical direction, part of the capacitive insulating film which stores the capacitance of the capacitor will not be exposed. Thus, the capacitive insulating film which contributes to the capacitance will not be damaged even if the opening is formed to overlap the capacitor. This eliminates the need of providing an alignment margin between the opening and the trench, through it has been necessary in conventional techniques. As a result, the trench is enlarged to be in contact with the opening at the top end part thereof, while the memory cell size is not changed. Thus, a larger capacitance is stored in the capacitor while device miniaturization is achieved.

Specifically, the above-mentioned opening is an opening for forming a bit line contact in a semiconductor memory of a CUB structure. According to this manufacturing method, in the step (e), the upper electrode is formed over the capacitive insulating film in the trench and the second insulating film outside the trench. The method further comprises the steps of: (f) forming on the upper electrode a mask having an opening corresponding to part of the region of the upper electrode formed on the top surface of the second insulating film and forming an opening in the upper electrode by etching; and (g) forming a bit line contact which penetrates the second insulating film and the first insulating film through the opening.

In the step (c), a conductive film is formed over the entire surface of the trench, a mask is formed to fill part of the trench below the boundary between the first insulating film and the second insulating film and part of the conductive film uncovered with the mask is removed by etching to form the lower electrode. By so doing, the upper end of the lower electrode becomes thinner than the other part of the lower electrode. In this case, the upper electrode is reduced in level difference which is generated at a part thereof covering the boundary between the first and second insulating films forming the trench sidewalls. As a result, even if the opening is misaligned to overlap the capacitor, the capacitive insulating film formed on the first insulating film forming the trench sidewalls is less likely to be removed.

DETAILED DESCRIPTION OF THE INVENTION

Embodiment 1

Hereinafter, an explanation is given of a method for manufacturing a semiconductor memory according to Embodiment 1 of the present invention with reference to the drawings. FIGS. 1A to 1C, 2A to 2C and 3 are sectional views illustrating the steps of manufacturing a DRAM of a CUB structure according to Embodiment 1 of the present invention.

Figure 1A:
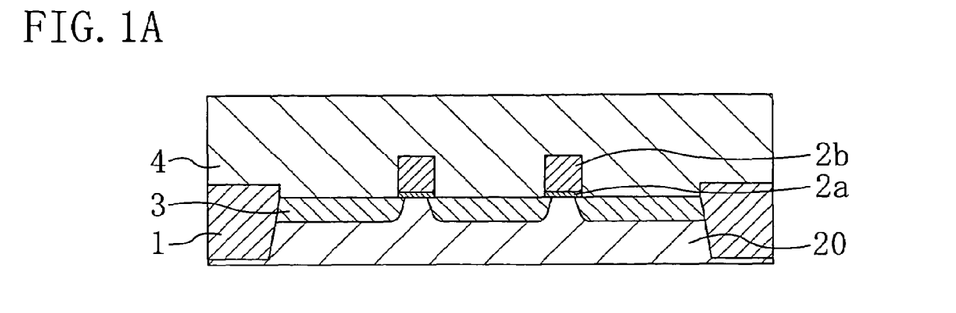
FIGS. 1A to 1C are sectional views illustrating the steps of manufacturing a DRAM of a CUB structure according to Embodiment 1 of the present invention.

According to the method of the present embodiment, in the step shown in FIG. 1A, an STI 1 is formed first to surround part of a silicon substrate 20 where a transistor will be formed. Then, a gate insulating film 2a of 6 nm in thickness is formed on the silicon substrate 20. Further, polysilicon (not shown) is deposited on the gate insulating film 2a and then dry-etched using a mask (not shown) formed on the polysilicon, thereby forming a gate electrode 2b of 150 nm in thickness which functions as a word line. Then, ion implantation is carried out using the gate electrode 2b as a mask to form an impurity diffusion layer 3 of 100 nm in thickness in part of the silicon substrate 20 located at each side of the gate electrode 2b. Then, a first interlayer insulating film 4 made of BPSG (boron phospho-silicate glass) is deposited on the silicon substrate 20 to cover the gate electrode 2b. The first interlayer insulating film 4 is then planarized by CMP so that it has a uniform thickness of about 500 nm.

Figure 1B:
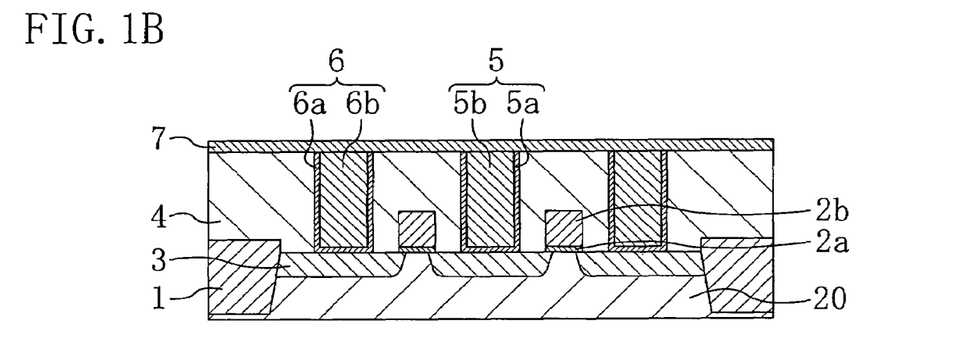

Then, in the step shown in FIG. 1B, a mask (not shown) is formed on the first interlayer insulating film 4 and etching is carried out to form a bit line contact hole (not shown) and a capacitor contact hole (not shown) which penetrate the first interlayer insulating film 4 to reach a drain region and a source region in the impurity diffusion layer 3, respectively. Then, the surfaces of the bit line contact hole and the capacitor contact hole are covered with barrier metals 5a and 6a made of TiN of 10 nm in thickness, respectively, and the contact holes are filled with conductive films 5b and 6b made of tungsten, respectively. Thus, a bit line contact 5 and a capacitor contact 6 are formed. Then, an insulating film 7 such as a silicon nitride film of 50 nm in thickness is deposited on the first interlayer insulating film 4.

Figure 1C:
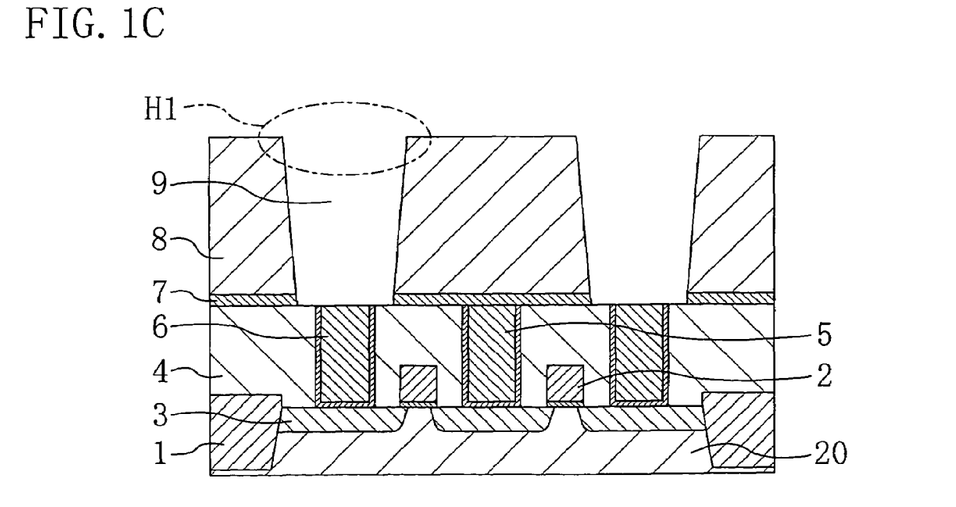

Further, in the step shown in FIG. 1C, a second interlayer insulating film 8 of 800 nm in thickness made of BPSG is formed on the insulating film 7. Then, a resist mask (not shown) having an opening corresponding to a capacitor region is formed on the second interlayer insulating film 8 and dry etching is carried out to remove the second interlayer insulating film 8 and the insulating film 7 in the capacitor region. Thus, a storage node hole 9 is formed. When viewed in plan, the top end part H1 of the storage node hole 9 (part of the sidewalls of the storage node hole 9 closer to the top surface of the interlayer insulating film 8) is in the form of a rectangle having a long side length of 0.5 μm and a short side length of 0.2 μm. The storage node hole 9 is formed by two-step dry etching. More specifically, first dry etching is carried out using the insulating film 7 as an etch-stop to remove the second interlayer insulating film 8 until the surface of the insulating film 7 is exposed, and then second dry etching is carried out to selectively remove the exposed insulating film 7.

Figure 2A:
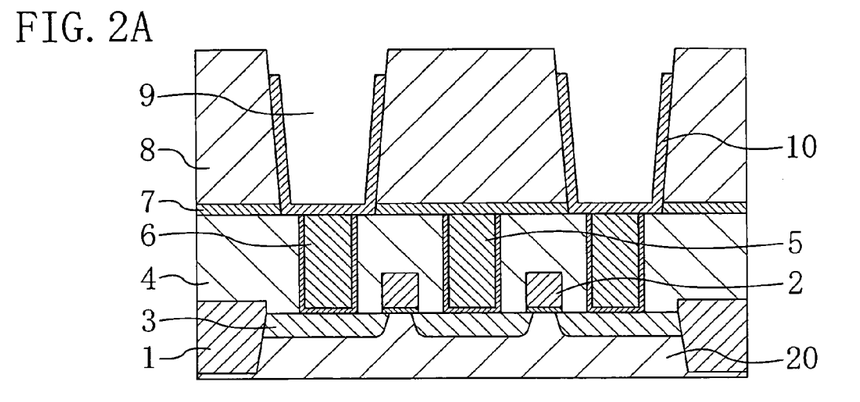
FIGS. 2A to 2C are sectional views illustrating the steps of manufacturing the DRAM of a CUB structure according to Embodiment 1 of the present invention.

Then, in the step shown in FIG. 2A, a TiN film of 30 nm in thickness (not shown) is formed over the bottom surface and the sidewalls of the storage node hole 9 and the surface of the second interlayer insulating film 8 outside the storage node hole 9. Then, a resist (not shown) is applied to the substrate and light exposure is carried out over the entire surface of the substrate to leave the resist (not shown) only in the storage node hole 9. Then, anisotropic etching is carried out to selectively remove the TiN film, thereby forming a lower electrode 10 made of TiN of 30 nm in thickness on the bottom surface and the sidewalls of the storage node hole 9. At this time, the anisotropic etching is carried out such that the TiN film is removed by about 80 nm in thickness, thereby positioning the upper end of the lower electrode 10 lower than the top surface of the second interlayer insulating film 8 by about 50 nm. That is, the lower electrode 10 is formed on the sidewalls of the storage node hole 9 at a deeper position than the top surface of the second interlayer insulating film 8 by about 50 nm or more.

Figure 2B:
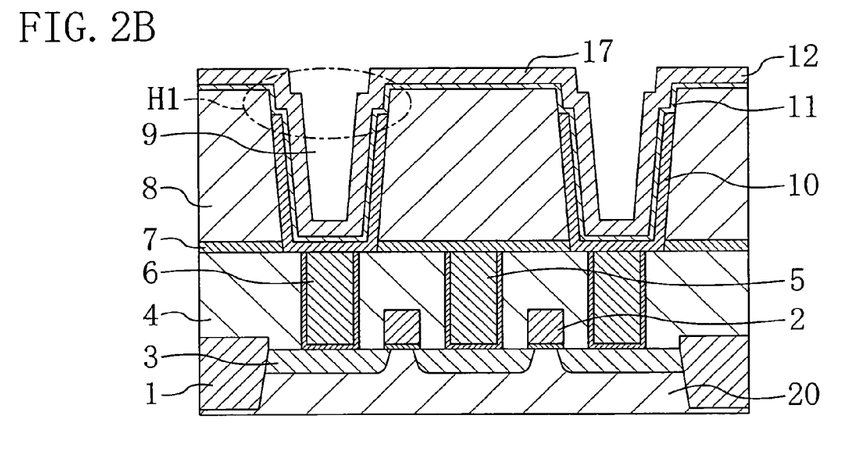

Then, in the step shown in FIG. 2B, a capacitive insulating film 11 made of $Ta_2O_5$ of 20 nm in thickness is deposited over the lower electrode 10 and the second interlayer insulating film 8. Since the lower electrode 10 is positioned lower than the top surface of the second interlayer insulating film 8, part of the sidewalls of the storage node hole 9 which is not in contact with the lower electrode 10, i.e., the surface of the top end part H1 of the storage node hole 9, comes into direct contact with the capacitive insulating film 11. Thereafter, a TiN film of about 50 nm in thickness (not shown) is formed on the capacitive insulating film 11 to form an upper electrode 12.

Figure 2C:
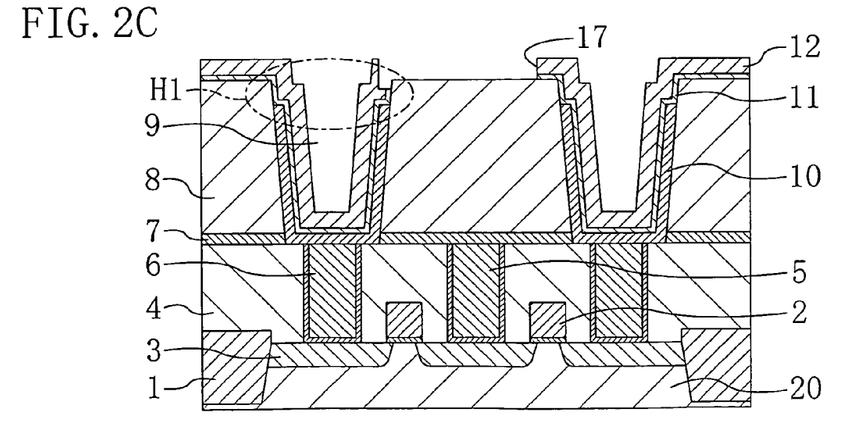

Then, in the step shown in FIG. 2C, a mask (not shown) having an opening in a bit line contact region is formed on the upper electrode 12 and etching is carried out to form an opening 17. At this time, the upper electrode 12 is over-etched by about 30%, i.e., about 15 nm in terms of the TiN film, so as not to leave the upper electrode 12 and the capacitive insulating film 11 in a bit line contact region the memory cell region and the other regions than the memory cell region. FIG. 2C shows that the opening 17 is misaligned from the desired position and the left end of the opening 17 reaches the capacitor in the storage node hole 9. The misalignment of the opening 17 is derived from the mask (not shown) for forming the opening 17 which is misaligned from the desired position.

Figure 3:
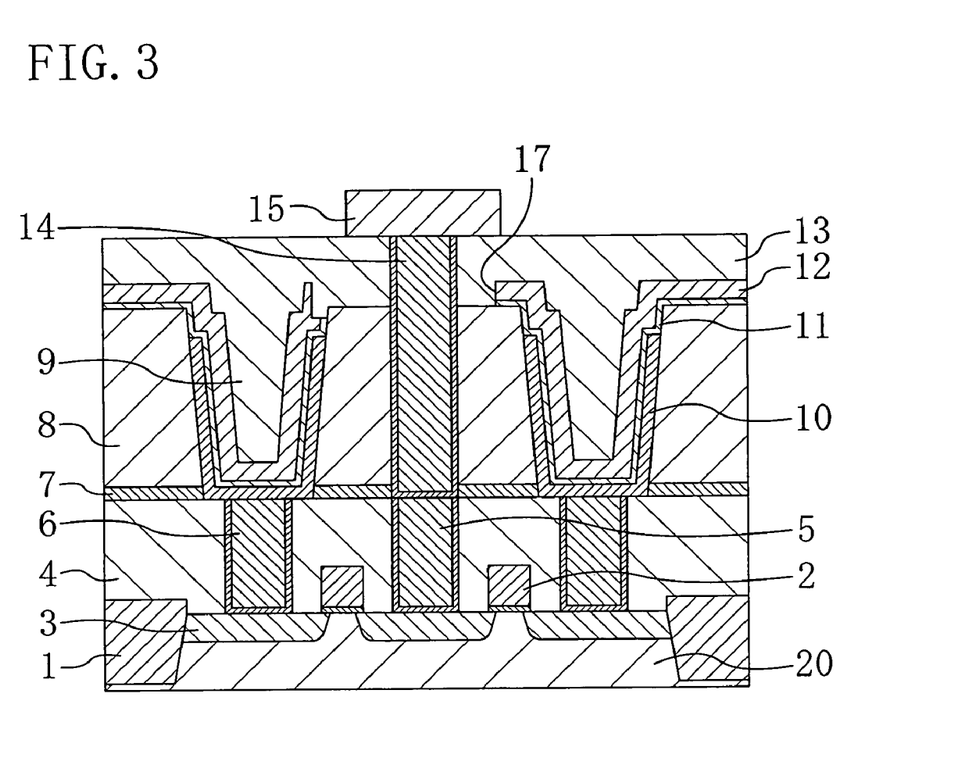
FIG. 3 is a sectional view illustrating the step of manufacturing the DRAM of a CUB structure according to Embodiment 1 of the present invention.

Then, in the step shown in FIG. 3, a third interlayer insulating film 13 of 600 nm in thickness made of BPSG is deposited on the upper electrode 12 and planarized by CMP such that the thickness thereof on the upper electrode 12 outside the storage node hole 9 is reduced to 200 nm. Then, a bit line contact 14 is formed through the third interlayer insulating film 13 and the second interlayer insulating film 8 below the opening 17 to reach the bit line contact 5. Then, a first wiring layer 15 is formed on the third interlayer insulating film 13 to be in contact with the bit line contact 14. Through the above steps, a capacitor of a CUB structure is obtained.

Hereinafter, the effect of the manufacturing method of the present embodiment will be described in comparison with that of the conventional method. In the conventional method, a margin c shown in FIG. 8B is narrowed as the device is further miniaturized. Therefore, as shown in FIG. 8A, an opening 117 is misaligned and an upper electrode 112 at the top end part H3 of a storage node hole 116 is removed to expose a capacitive insulating film 111.

On the other hand, in the present embodiment, the lower electrode 10 is positioned lower than the top surface of the second interlayer insulating film 8 as shown in FIG. 2C. Accordingly, at the top end part H1 of the storage node hole 9, the upper electrode 12 is formed along the sidewalls of the storage node hole 9. As a result, part of the upper electrode 12 at the top end part H1 of the storage node hole 9 is given with a large thickness as compared with that obtained by the conventional technique. Therefore, in the step of forming the opening 17, even if the opening 17 is misaligned to overlap the capacitor and the upper electrode 12 is over-etched in the vertical direction, part of the capacitive insulating film 11 which stores the capacitance of the capacitor will not be exposed. The part of the capacitive insulating film 11 which stores the capacitance of the capacitor mentioned herein is part of the capacitive insulating film 11 sandwiched between the upper and lower electrodes 12 and 10. For example, the lower electrode 10 does not exist at part of the capacitive insulating film 11 sandwiched between the top end part H1 of the storage node hole 9 and the upper electrode 12. Therefore, even if the capacitive insulating film 12 is exposed as shown in FIG. 2C, adverse effect such as the occurrence of leakage current is not caused.

Figure 4:
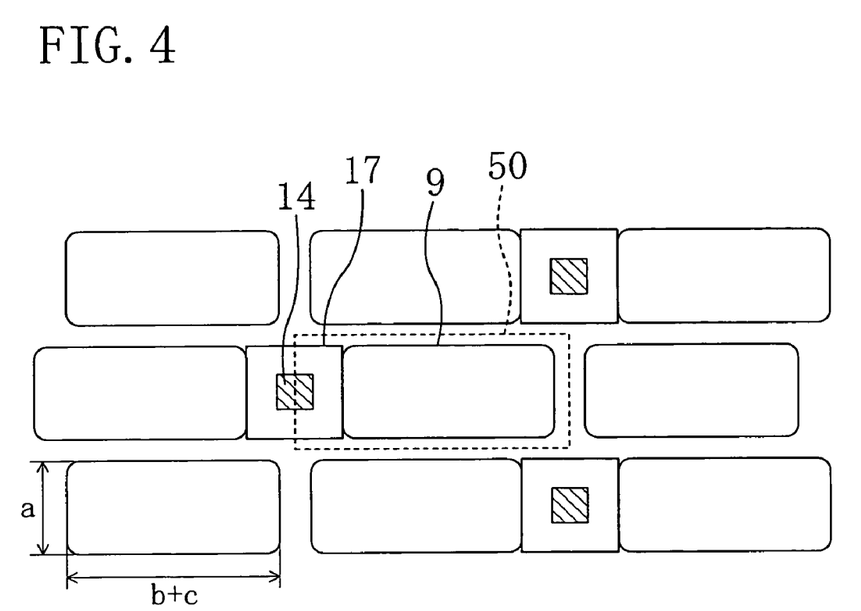
FIG. 4 is a plan view illustrating a configuration of a semiconductor memory according to Embodiment 1 of the present invention.

As described above, if a capacitor is formed by the method of the present embodiment, the capacitance of the capacitor will not be affected even if the opening 17 is formed to overlap the capacitor. This eliminates the need of providing an alignment margin c between the opening 17 and the capacitor in the storage node hole 9, though it has been necessary in the conventional method. That is, according to the present embodiment, the storage node hole 9 is enlarged to be in contact with the opening 17 at the top end part H1 as shown in FIG. 4, while the memory cell size is not changed. Thus, a larger amount of capacitance is stored in the capacitor while device miniaturization is achieved. FIG. 4 is a view illustrating a planar configuration of the semiconductor memory of Embodiment 1 of the present invention.

Next, a comparison as to the total area of the capacitor is made between the capacitor of the present embodiment and a conventional capacitor. The total area of the capacitor mentioned herein is the sum of the area of the capacitor at the bottom of the storage node hole 9 (bottom area) and the area of the capacitor at the sidewalls of the storage node hole 9 (lateral area). The conventional capacitor shown in FIG. 8B has a short side length a of 0.2 µm, a long side length b of 0.45 µm and an alignment margin c of 0.05 µm and the storage node hole 9 has a height of 0.85 µm (height of the capacitor region). Under these conditions, the total area of the conventional capacitor is calculated as follows.

Bottom area: $0.2 \times 0.45 = 0.09$ (µm$^2$)

Lateral area: $0.85 \times (0.45 \times 2 + 0.2 \times 2) = 1.105$ (µm$^2$)

Total area: $0.09 + 1.105 = 1.195$ (µm$^2$)

On the other hand, the present embodiment eliminates the need of the alignment margin. Therefore, the long side length of the capacitor increases by 0.05 µm in a memory cell having the same area as the conventional memory cell. Further, at the top end part of the storage node hole 9, the lower electrode 10 is formed at a deeper position than the top surface of the second interlayer insulating film 8 by 50 nm or more. Therefore, the height of the capacitor becomes smaller by 0.05 µm than the conventional capacitor. As a result, the capacitor of the present embodiment has a short side length a of 0.2 µm, a long side length b (including the margin c) of 0.5 µm and the height of 0.8 µm. Under these conditions, the total area is calculated as follows.

Bottom area: $0.2 \times 0.5 = 0.1$ (µm$^2$)

Lateral area: $0.8 \times (0.5 \times 2 + 0.2 \times 2) = 1.12$ (µm$^2$)

Total area: $0.1 + 1.12 = 1.22$ (µm$^2$)

From the above results, it is understood that the capacitor of the present embodiment is given with a larger area than the conventional capacitor.

Embodiment 2

Hereinafter, with reference to the drawings, an explanation is given of a method for manufacturing a semiconductor memory according to Embodiment 2 of the present invention. FIGS. 5A to 5C, 6A to 6C and 7 are sectional views illustrating the steps of manufacturing a DRAM of a CUB structure according to Embodiment 2 of the present invention.

Figure 5A:
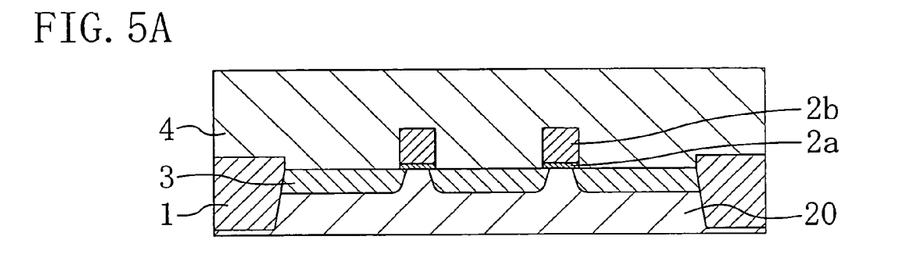
FIGS. 5A to 5C are sectional views illustrating a DRAM of a CUB structure according to Embodiment 2 of the present invention.
Figure 5B:
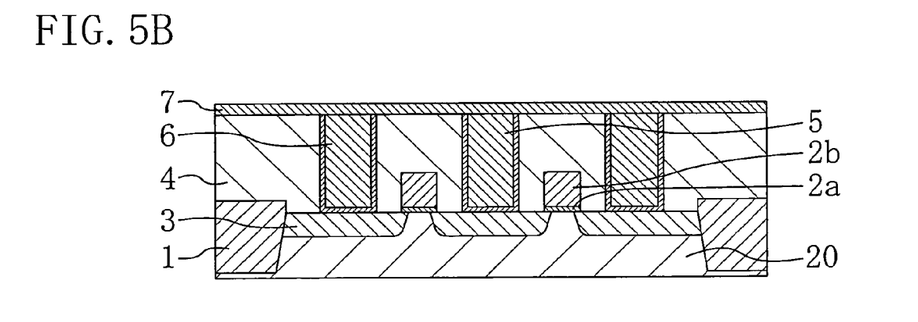

According to the method of the present embodiment, an STI 1 is formed in a silicon substrate 20, and then a gate insulating film 2a, a gate electrode 2b, an impurity diffusion layer 3 and a first interlayer insulating film 4 are formed in the step shown in FIG. 5A in the same manner as Embodiment 1. Then, in the step shown in FIG. 5B, a bit line contact 5, a capacitor contact 6 and an insulating film 7 are formed.

Figure 5C:
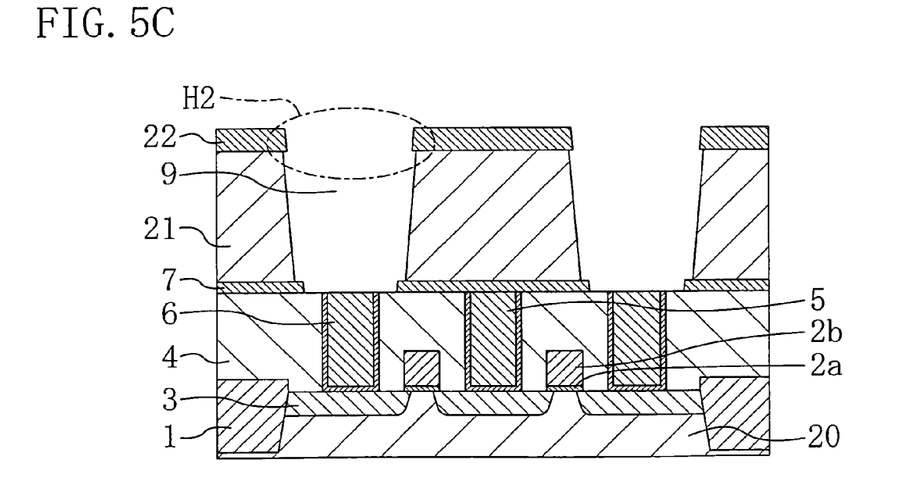

Then, in the step shown in FIG. 5C, a second interlayer insulating film 21 of 750 nm in thickness is formed on the insulating film 7 and an insulating film 22 of 50 nm in thickness is formed on the second interlayer insulating film 21. The second interlayer insulating film 21 is made of a material which is wet-etched at a higher rate than the insulating film 22. For example, the second interlayer insulating film 21 may be made of PSG and the insulating film 22 may be made of NSG. As described later, the wet etching mentioned herein is carried out to etch the second interlayer insulating film 21 and the insulating film 22 to form a storage node hole 9.

Then, a resist (not shown) having an opening corresponding to the capacitor region is formed on the insulating film 22 and dry etching is carried out using the resist as a mask, thereby forming a storage node hole 9 which penetrates the insulating film 22, the second interlayer insulating film 21 and the insulating film 7 to reach the top surface of the capacitor contact 6. Then, wet etching is carried out using a hydrofluoric acid solution under such conditions that the second interlayer insulating film 21 is etched faster than the insulating film 22. Thus, in the storage node hole 9, the second interlayer insulating film 21 is removed more than the insulating film 22. As a result, part of the storage node hole 9 where the second interlayer insulating film 21 forms the sidewalls thereof becomes about 40 nm larger in diameter than part of the storage node hole 9 where the insulating film 22 forms the sidewalls thereof.

Instead of forming the second interlayer insulating film 21 and the insulating film 22 from different materials, boron may be implanted into the top part of an interlayer insulating film (not shown) so that the top part of the interlayer insulating film is given with an etch rate different from that of the other part. For example, the interlayer insulating film is formed to have a thickness of 800 nm and then boron is implanted therein down to a depth of 50 nm from the top surface thereof. Since the wet-etch rate decreases with an increase in boron concentration, the top part of the interlayer insulating film becomes lower in etch rate than the other part.

Figure 6A:
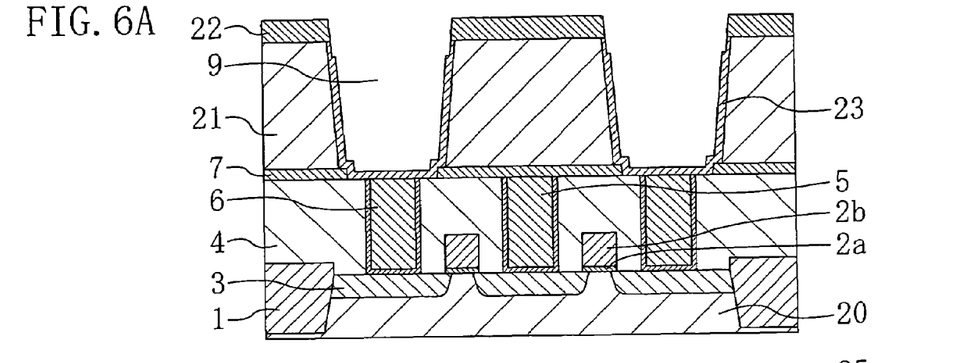
FIGS. 6A to 6C are sectional views illustrating the DRAM of a CUB structure according to Embodiment 2 of the present invention.

Then, in the step shown in FIG. 6A, a TiN film of 30 nm in thickness (not shown) is formed on the bottom surface and the sidewalls of the storage node hole 9. Thereafter, a resist (not shown) is applied to the substrate and light exposure is carried out over the entire surface of the substrate, thereby leaving the resist only in the storage node hole 9. Then, etching is carried out to remove only 130 nm of the TiN film to form a lower electrode 23 made of TiN. In this etching step, the upper end of the lower electrode 23 which is uncovered with the resist is thinned down to about 10 nm in thickness, while the other part of the lower electrode 23 remains unetched because it is covered with the resist.

Figure 6B:
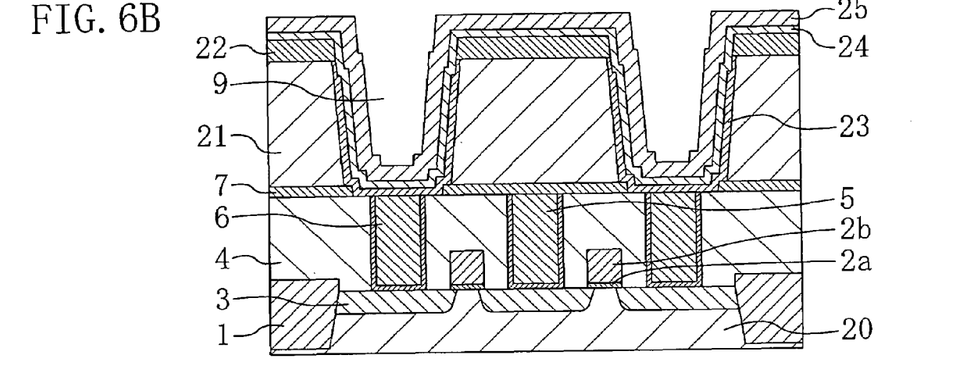

Then, in the step shown in FIG. 6B, a capacitive insulating film 24 made of $Ta_2O_5$ of 20 nm in thickness is formed on the lower electrode 23 in the storage node hole 9 and the insulating film 22 outside the storage node hole 9. Then, an upper electrode 25 made of TiN of 50 nm in thickness is formed on the capacitive insulating film 24.

Figure 6C:
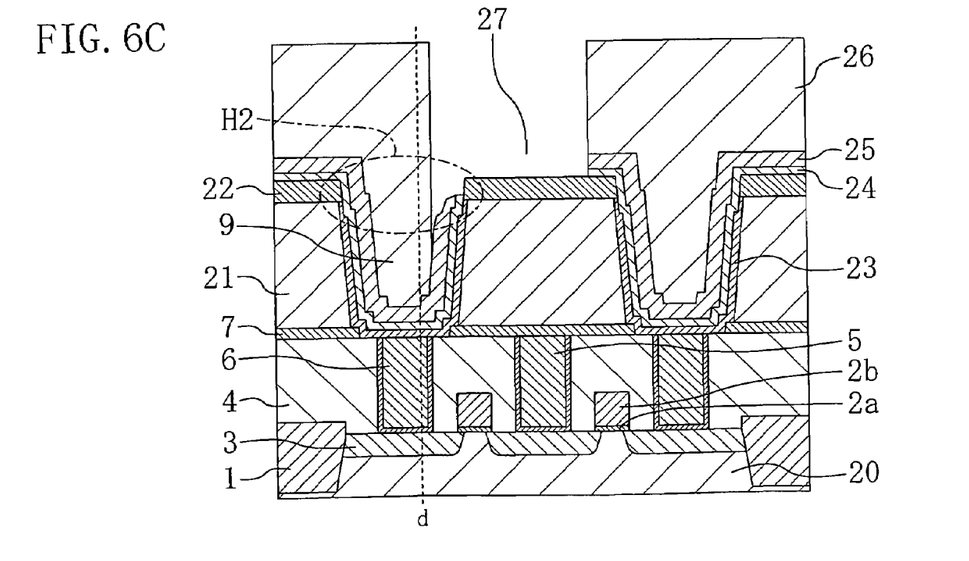

Then, in the step shown in FIG. 6C, a mask 26 having an opening corresponding to a bit line contact region is formed on the upper electrode 25, and then dry etching is carried out using the mask 26 to form an opening 27. FIG. 6C shows the opening 27 which is misaligned from the desired position and the left end of the opening 27 reaches the capacitor in the storage node hole 9. The misalignment of the opening 27 is derived from the mask 26 which is misaligned from the desired position.

Figure 7:
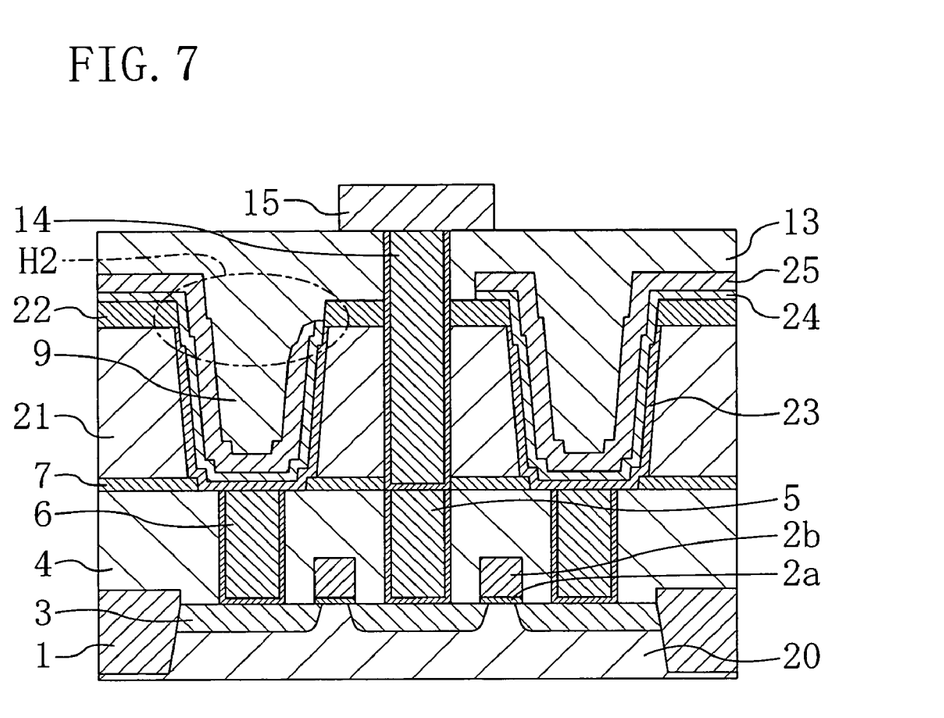
FIG. 7 is a sectional view illustrating the step of manufacturing the DRAM of a CUB structure according to Embodiment 2 of the present invention.

Then, in the step shown in FIG. 7, a third interlayer insulating film 13, a bit line contact 14 and a first wiring layer 15 are formed in the same manner as Embodiment 1. Through the above-described steps, a capacitor of a CUB structure is obtained.

In the capacitor of the present embodiment, as shown in FIG. 5C, the side edge of the insulating film 22 at the top end part H2 of the storage node hole 9 protrudes toward more inside of the storage node hole 9 than the side edge of the second interlayer insulating film 21. Since the lower electrode 23 is not formed on the protruding side edge of the insulating film 22 at the top end part H2 of the storage node hole 9, the capacitive insulating film 24 formed on the insulating film 22 at the top end part H2 of the storage node hole 9 does not store the capacitance. Therefore, no problems arise even if the opening 27 is misaligned to overlap the capacitor as shown in FIG. 6C, thereby removing parts of the upper electrode 25 and the capacitive insulating film 24 formed at the top end part H2 of the storage node hole 9. On the other hand, the capacitance is stored in the lower electrode 23, capacitive insulating film 24 and upper electrode 25 which are formed at a level lower than the top end part H2 of the storage node hole 9. As shown in FIG. 7, since the insulating film 22 at the top end part H2 of the storage node hole 9 protrudes toward inside of the storage node hole 9 to generate a dent part below it, the upper electrode 25 is reduced in level difference which is generated at part thereof covering the boundary between the insulating film 22 and the dent part below it. Therefore, even if the opening 27 is misaligned to overlap the capacitor, the lower electrode 23, capacitive insulating film 24 and upper electrode 25 formed in the storage node hole 9 at a level lower than the insulating film 22 are less likely to be removed.

As described above, in the capacitor manufactured by the method of the present embodiment, the capacitive insulating film 24 which contributes to the capacitance will not be damaged even if the opening 27 overlaps the capacitor. Therefore, unlike the conventional method, there is no need of providing an alignment margin between the opening 27 and the capacitor in the storage node hole 9. More specifically, in the present embodiment, the capacitor in the storage node hole 9 is enlarged to be in contact with the opening 17, while the memory cell size is not changed. As a result, a larger amount of capacitance is stored while device miniaturization is achieved.

In the present embodiment, the following conditions are preferably satisfied so as to prevent the capacitive insulating film 24 which contributes to the capacitance from damage even when the opening 27 overlaps the capacitor. As a first condition, the side edge of the insulating film 22 is formed to protrude toward more inside of the storage node hole 9 than the side edge of the second interlayer insulating film 21 by the length same as or larger than the thickness of the lower electrode 23. If the protruding length of the side edge of the insulating film 22 is smaller than the thickness of the lower electrode 23, as a second condition, the upper electrode 25 is formed to have a thickness larger than the difference between the thickness of the lower electrode 23 and the protruding length of the insulating film 22 (the thickness of the lower electrode 23 minus the protruding length). If one of these conditions is satisfied, the capacitive insulating film 24 which contributes to the capacitance will not be damaged by dry etching for forming the opening 27. The opening 27 is allowed to overlap the capacitor as long as it does not exceed a boundary d shown in FIG. 6C, i.e., as long as the capacitive insulating film 24 formed at the bottom of the storage node hole 9 is not exposed.

What is claimed is:

1. A semiconductor memory comprising:
   a first interlayer insulating film formed on a silicon substrate having an impurity diffusion layer;
   a capacitor contact formed to penetrate the first interlayer insulating film and connected to the impurity diffusion layer;
   a second interlayer insulating film formed on the first interlayer insulating film;
   a trench formed to penetrate the second interlayer insulating film and connected to the capacitor contact;
   a lower electrode formed only in the trench and connected to the capacitor contact;
   a capacitive insulating film directly formed on the lower electrode;
   an upper electrode formed on the capacitive insulating film; and
   a third interlayer insulating film formed on the upper electrode;
   wherein the lower electrode is not formed in an upper region of side surfaces of the second interlayer insulating film in the trench,
   the capacitive insulating film is formed directly on the upper region of side surfaces of the second interlayer insulating film, and
   the capacitive insulating film and the upper electrode extend from a side surface of the second interlayer insulating film within the trench onto a top surface of the second interlayer insulating film, and
   said third interlayer insulating film is buried in the trench with the upper electrode interposed therebetween.

2. A semiconductor memory according to claim 1, wherein the upper end of the lower electrode is positioned lower than the top surface of the second interlayer insulating film by a distance which is 0.3 or more times larger than the thickness of the upper electrode.

3. A semiconductor memory according to claim 1, wherein the lower electrode comprises a single layer film.

4. A semiconductor memory according to claim 3, wherein the single layer film is a TiN film.

5. A semiconductor memory according to claim 1, wherein the upper electrode comprises a single layer film.

6. A semiconductor memory according to claim 1, wherein the capacitive insulating film is made of a $Ta_2O_5$ film.

7. A semiconductor memory according to claim 1, further comprising:
   a bit line contact formed to penetrate the second interlayer insulating film, wherein the upper electrode includes on the top surface of the second interlayer insulating film, an opening surrounding the bit line contact and having an edge apart from the bit line contact.

8. A semiconductor memory according to claim 1, wherein the lower electrode is formed on a sidewall of the trench, in a region 50 nm or more away from the top surface of the second interlayer insulating film.

9. A semiconductor memory comprising:
a first interlayer insulating film formed on a silicon substrate having an impurity diffusion layer;
a capacitor contact formed to penetrate the first interlayer insulating film and connected to the impurity diffusion layer;
a second interlayer insulating film formed on the first interlayer insulating film;
an insulating film formed on the second interlayer insulating film and having an etch rate different from the second interlayer insulating film;
a trench formed to penetrate the second interlayer insulating film and the insulating film and connected to the capacitor contact;
a lower electrode formed only in the trench and connected to the capacitor contact;
a capacitive insulating film directly formed on the lower electrode;
an upper electrode formed on the capacitive insulating film; and
a third interlayer insulating film formed on the upper electrode;
wherein the lower electrode is not formed on side surfaces of the insulating film in the trench,
the capacitive insulating film is formed directly on side surfaces of the insulating film, and
the capacitive insulating film and the upper electrode extend from a side surface of the second interlayer insulating film within the trench onto a top surface of the second interlayer insulating film, and
said third interlayer insulating film is buried in the trench with the upper electrode interposed therebetween.

10. A semiconductor memory according to claim 9, wherein the upper end of the lower electrode is thinner than the other part of the lower electrode.

11. A semiconductor memory according to claim 9, wherein the insulating film protrudes toward the inside of the trench beyond the second interlayer insulating film by a length larger than the difference in thickness between the lower electrode and the capacitive insulating film.

12. A semiconductor memory according to claim 9, wherein the second interlayer insulating film is made of phospho-silicate glass and the insulating film is made of non-doped silicate glass.

13. A semiconductor memory according to claim 5, wherein the single layer film is a TiN film.

14. A semiconductor memory according to claim 9, wherein in the trench, the insulating film overhangs the second interlayer insulating film.

15. A semiconductor memory according to claim 9, wherein the lower electrode comprises a single layer film.

16. A semiconductor memory according to claim 15, wherein the single layer film is a TiN film.

17. A semiconductor memory according to claim 9, wherein the upper electrode comprises a single layer film.

18. A semiconductor memory according to claim 17, wherein the single layer film is a TiN film.

19. A semiconductor memory according to claim 9, wherein the capacitive insulating film is made of a $Ta_2O_5$ film.

20. A semiconductor memory according to claim 9, further comprising:
a bit line contact formed to penetrate the second interlayer insulating film,
wherein the upper electrode includes on the top surface of the second interlayer insulating film, an opening surrounding the bit line contact and having an edge apart from the bit line contact.

* * * * *